United States Patent
Franke et al.

(10) Patent No.: US 10,222,861 B2
(45) Date of Patent: Mar. 5, 2019

(54) TOUCH-SENSITIVE DEVICE WITH HAPTIC FEEDBACK

(71) Applicant: e.solutions GmbH, Ingolstadt (DE)

(72) Inventors: Thomas Franke, Laupheim (DE);
Thomas Fuessinger, Ulm (DE);
Juergen Joos, Amstetten (DE); Stefan Christmann, Geislingen/Steige (DE);
Jens Bartels, Ulm (DE)

(73) Assignee: E.SOLUTIONS GmbH (DE)

( * ) Notice: Subject to any disclaimer, the term of this patent is extended or adjusted under 35 U.S.C. 154(b) by 0 days.

(21) Appl. No.: 15/265,208

(22) Filed: Sep. 14, 2016

(65) Prior Publication Data
US 2017/0075423 A1 Mar. 16, 2017

(30) Foreign Application Priority Data
Sep. 16, 2015 (DE) .......................... 10 2015 012 178

(51) Int. Cl.
| | |
|---|---|
| *G06F 3/01* | (2006.01) |
| *B60K 37/06* | (2006.01) |
| *G06F 3/0354* | (2013.01) |
| *H03K 17/96* | (2006.01) |
| *H03K 17/955* | (2006.01) |

(52) U.S. Cl.
CPC .............. *G06F 3/016* (2013.01); *B60K 37/06* (2013.01); *G06F 3/03547* (2013.01); *B60K 2350/1012* (2013.01); *B60K 2350/1024* (2013.01); *G06F 2203/04105* (2013.01);
(Continued)

(58) Field of Classification Search
None
See application file for complete search history.

(56) References Cited

U.S. PATENT DOCUMENTS

| | | |
|---|---|---|
| 8,633,916 B2 | 1/2014 | Bernstein et al. |
| 8,816,978 B2 | 8/2014 | Hirano et al. |
| | (Continued) | |

FOREIGN PATENT DOCUMENTS

| | | |
|---|---|---|
| CN | 104049795 A | 9/2014 |
| DE | 60027515 T2 | 9/2006 |
| | (Continued) | |

OTHER PUBLICATIONS

Chinese Application No: 201610833593.9; Applicant: e.solutions GmbH; Chinese Examination Report dated Oct. 3, 2018, 11 pgs. (See attached English Translation).

*Primary Examiner* — Nicholas J Lee
(74) *Attorney, Agent, or Firm* — Tarolli, Sundheim, Covell & Tummino LLP

(57) ABSTRACT

A touch-sensitive device with haptic feedback is described. In one embodiment, the device comprises a layer sequence which has a translucent cover element with an upper side and a touch-sensitive arrangement which is arranged on a side of the cover element lying opposite the upper side and is designed to detect contact with the upper side of the cover element. In the embodiment, the device comprises at least one first actuator which is designed to transmit a movement impulse to the layer sequence in such a way that a haptically detectable movement of the cover element is brought about, and a second actuator which is designed to generate electrostatic signals which can be detected haptically at the cover element.

27 Claims, 5 Drawing Sheets

(52) U.S. Cl.
CPC .. *G06F 2203/04108* (2013.01); *H03K 17/955* (2013.01); *H03K 17/962* (2013.01); *H03K 2217/96062* (2013.01)

(56) References Cited

U.S. PATENT DOCUMENTS

| | | | |
|---|---|---|---|
| 8,847,905 B2 | 9/2014 | Hirano et al. | |
| 2003/0184574 A1 | 10/2003 | Phillips et al. | |
| 2012/0281380 A1* | 11/2012 | Werner | G06F 1/1626 361/807 |
| 2012/0326999 A1* | 12/2012 | Colgate | G06F 3/016 345/173 |
| 2013/0057509 A1* | 3/2013 | Cruz-Hernandez | G06F 3/044 345/174 |
| 2014/0267065 A1 | 9/2014 | Levesque | |
| 2015/0009168 A1* | 1/2015 | Levesque | H04M 19/04 345/174 |
| 2015/0145657 A1* | 5/2015 | Levesque | G06F 3/016 340/407.2 |
| 2015/0205357 A1 | 7/2015 | Virtanen et al. | |

FOREIGN PATENT DOCUMENTS

| | | |
|---|---|---|
| DE | 102005011633 A1 | 9/2006 |
| DE | 102010005483 A1 | 8/2010 |
| DE | 102011110471 A1 | 2/2013 |
| EP | 2821912 A1 | 1/2015 |
| WO | 2013007882 A1 | 1/2013 |

\* cited by examiner

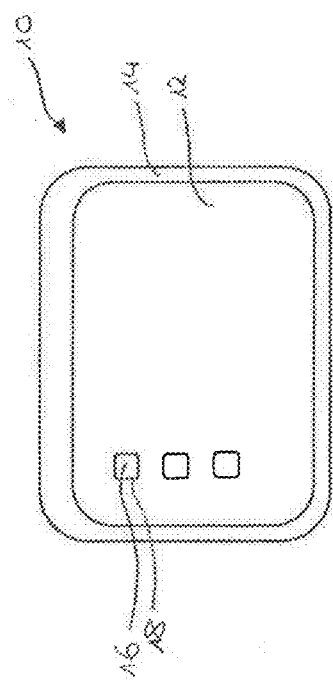
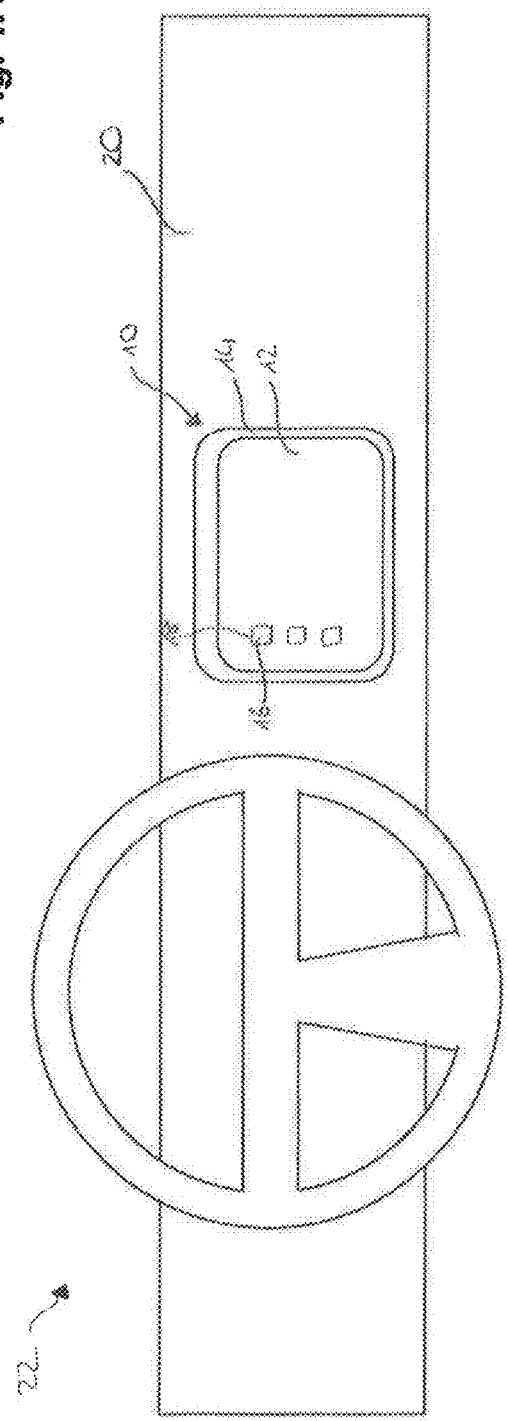
Fig. 1A
Fig. 1B

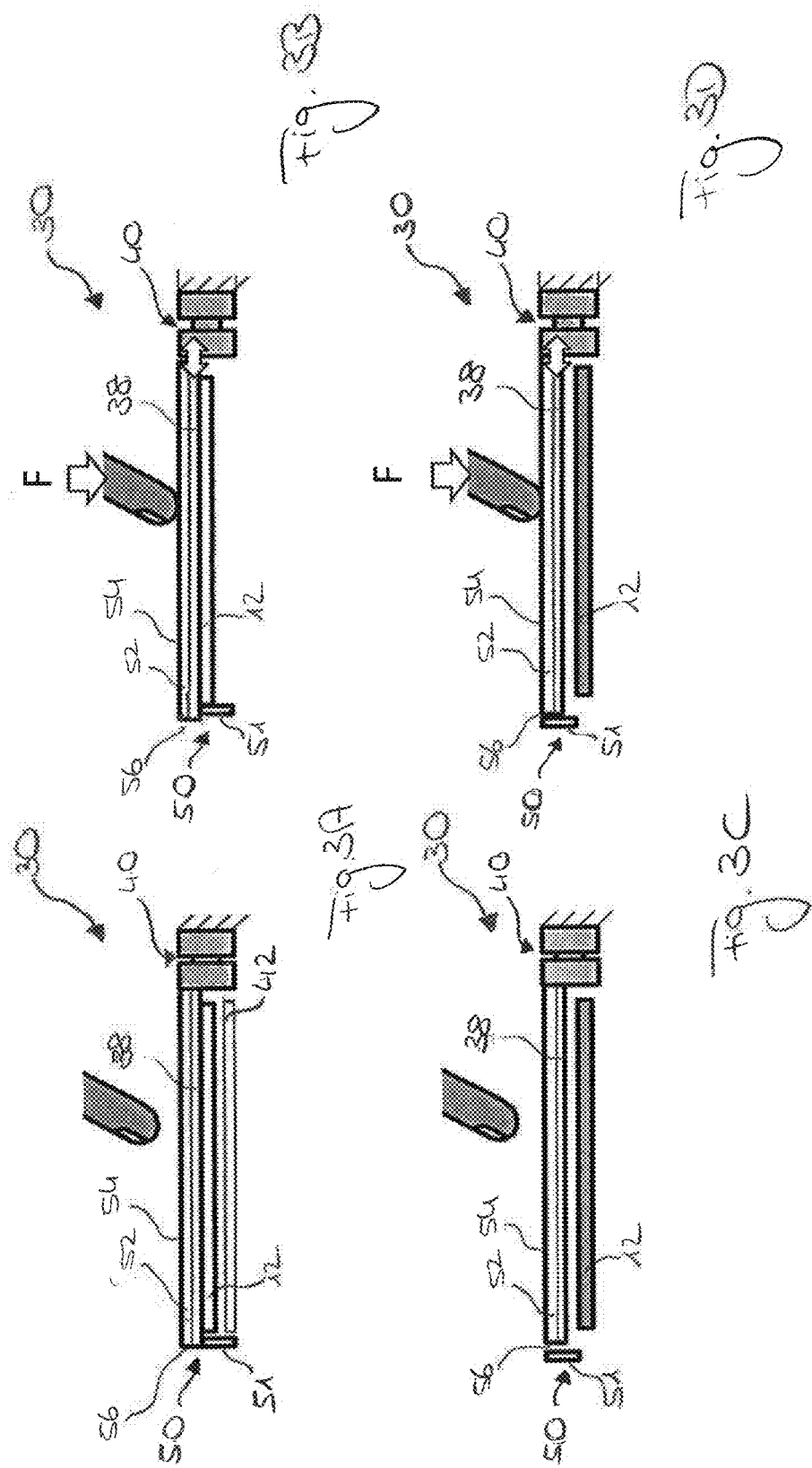

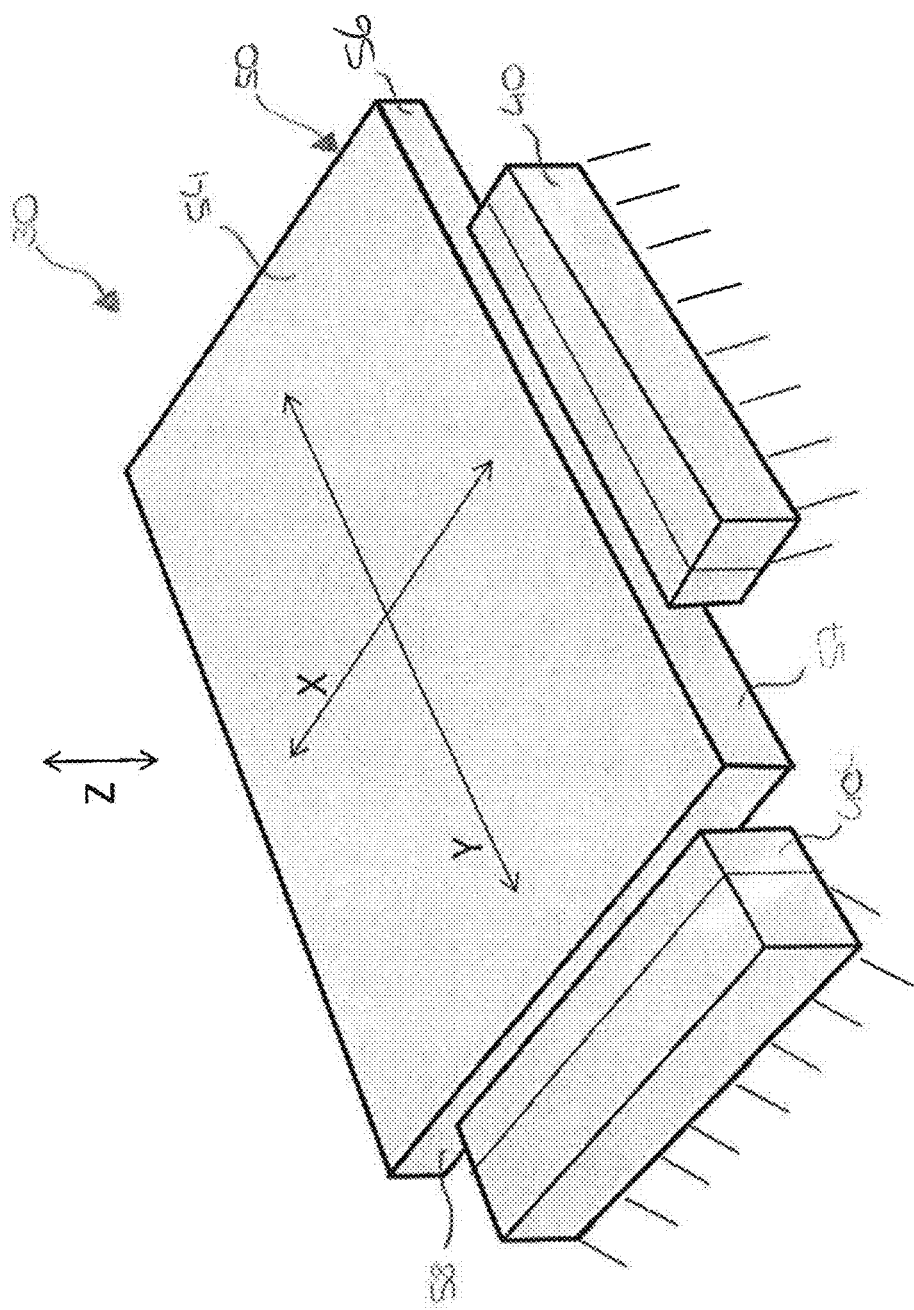

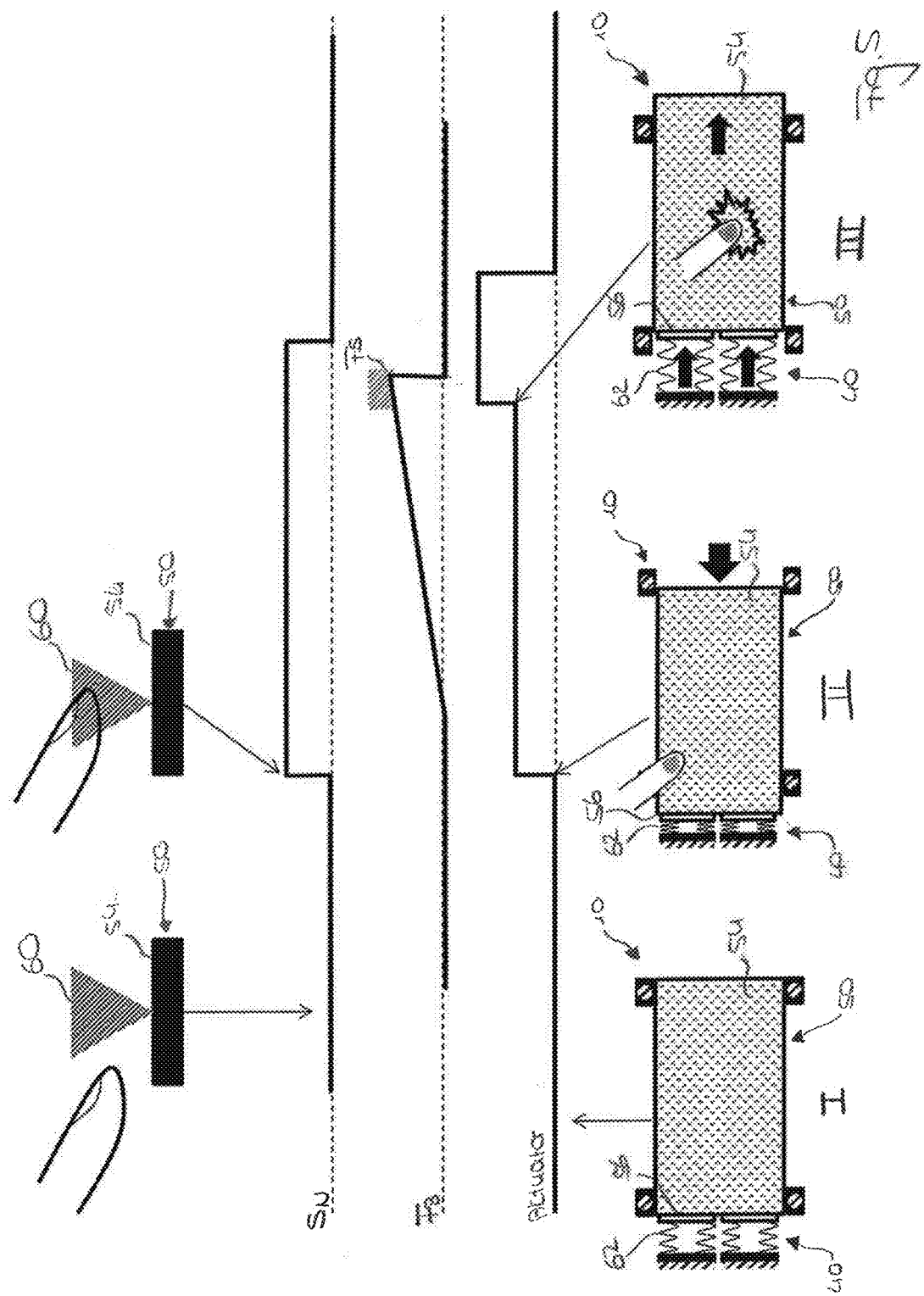

TOUCH-SENSITIVE DEVICE WITH HAPTIC FEEDBACK

CROSS-REFERENCE TO RELATED APPLICATION

The present application claims priority under 35 U.S.C. § 119 from Germany Patent Application No. 10 2015 012 178.2, filed 16 Sep. 2015, and entitled TOUCH-SENSITIVE DEVICE WITH HAPTIC FEEDBACK, which is incorporated herein by reference in its entirety.

TECHNICAL FIELD

The present disclosure relates generally to the field of touch-sensitive devices. Specifically, touch-sensitive devices with haptic feedback, an electronic apparatus comprising a touch-sensitive device, a motor vehicle comprising the electronic apparatus and methods for bringing about haptic feedback to a user of the electronic apparatus are specified.

BACKGROUND

In many areas of electronics, in particular entertainment electronics and motor vehicle electronics, increasing use has been made of touch-sensitive devices. The touch-sensitive devices are typically used as a touchpad or together with a display device as a touch screen in electronic apparatuses such as mobile phones (Smartphones), laptops and table computers. Such touch-sensitive devices are also used in motor vehicles, for example as a component of a multimedia unit which is integrated into the motor vehicles.

In certain situations, in particular in the case of use in a motor vehicle, it is desirable to embody the touch-sensitive device in such a way that it can be operated by the user without visual contact. It is therefore possible to ensure that the user (e.g. a driver of the motor vehicle) is not distracted from the events on the road around him while he is operating the touch-sensitive device.

It is already known to equip touch-sensitive devices with haptically detectable feedback. The feedback is conventionally implemented by means of mechanical actuators, which, when a user touches an upper side of the touch-sensitive device, bring about a movement of the upper side which can be detected by the user. Such a movement, which is typically directed perpendicularly to the upper side, is perceived by the user, for example, as a confirmation of an input on the touch-sensitive device.

Such mechanical actuators for bringing about the haptic feedback to the user are generally arranged underneath the upper side of the touch-sensitive device. However, this arrangement brings about a considerable increase in a height of the touch-sensitive device starting from the upper side, and therefore is in conflict with the requirement to increasingly reduce the size of electronic apparatuses. It is also frequently not easily possible to perform operator control of conventional touch-sensitive devices without visual contact. In addition, in such touch-sensitive devices there are numerous further disadvantages which are frequently not yet perceived by the experts in the field.

SUMMARY

An improved touch-sensitive device with haptic feedback is to be specified.

According to a first aspect, a touch-sensitive device with haptic feedback is specified. The touch-sensitive device comprises a layer sequence which has a translucent cover element with an upper side and a touch-sensitive arrangement which is arranged on a side of the cover element lying opposite the upper side and is designed to detect a touch on the upper side of the cover element. The touch-sensitive device also comprises at least one first actuator which is designed to transmit a movement impulse to the layer sequence in such a way that a haptically detectable movement of the cover element is brought about, and a second actuator which is designed to generate electrostatic signals which are detectable haptically at the cover element.

The first actuator can be designed to bring about the haptically detectable movement of the cover element, for example, as a Shape Memory Alloy (SMA) actuator, as a magnetic actuator or as a piezoelectric actuator. It is possible to provide that the first actuator brings about a movement of the cover element in the tenth of a millimeter range. The electrostatic signals generated by the second actuator can correspond to an electrostatic force between the upper side of the cover element and a user who touches the upper side of the cover element or approaches the upper side of the cover element.

The layer sequence can further comprise a display arrangement which is arranged on the side of the cover element lying opposite the upper side and is designed to display visual information. The display arrangement can be, for example, a liquid crystal display arrangement, an OLED display arrangement or an LED display arrangement. The second actuator can be designed to generate the electrostatic signals in accordance with displayed visual information and/or to change the electrostatic force in accordance with the displayed visual information.

The visual information which is displayed by the display arrangement can contain at least one virtual operator control element (e.g. a display of a control button, of a sliding regulator, of a rotary regulator etc.), and the electrostatic signals can indicate a boundary of the at least one operator control element. In this context it is possible to provide that the second actuator generates the electrostatic signals if the user of the touch-sensitive device touches the upper side of the cover element in the region of a boundary of the operator control element (e.g. an edge of the control button) which is displayed on the display arrangement. The electrostatic signals can be detected haptically by the user if the user makes a movement on the upper side of the cover element (e.g. over and beyond a displayed boundary of the operator control element).

The first actuator can be designed to transmit the movement impulse to the layer sequence when the contact detected by means of the touch-sensitive arrangement can be assigned to an input operation. The assignment of the detected contact of an input operation can take place as a function of a force applied in the direction of the upper side of the cover element by the user. It is therefore possible, for example, to provide for the detected contact to be assigned to an input operation in the case of a force starting from or above a predefined force threshold value. For this purpose it is also possible to provide that the touch-sensitive device comprises a force sensor which is designed to detect the force applied in the direction of the upper side of the cover element. The second actuator can be designed to generate the electrostatic signal when the contact detected by means of the touch-sensitive arrangement can be assigned to a scanning operation.

The layer sequence can have a cover face formed by the upper side of the cover element and a circumferential side face. In this case, the first actuator can be designed to transmit the movement impulse to at least one region of the side face of the layer sequence in such a way that a haptically detectable movement of the cover element is brought about essentially parallel to the direction of the movement impulse (wherein only the movement of the upper side of the cover element can be detected as such by the user, but not the specific direction of movement).

It is therefore generally possible to provide the first actuator in the region of the side faces of the layer sequence (e.g. adjoining a region of the side faces). As an alternative to this, the first actuator can be arranged on a side of the cover element lying opposite the upper side.

According to a second aspect, a touch-sensitive device with haptic feedback is specified. The touch-sensitive device comprises a layer sequence with a cover face and a circumferential side face. The layer sequence comprises a translucent cover element with an upper side which forms the cover face of the layer sequence, and a touch-sensitive arrangement which is arranged on a side of the cover element lying opposite the upper side and is designed to detect a touch on the upper side of the cover element. The touch-sensitive device also has at least one first actuator which is designed to transmit a movement impulse to at least one region of the side face of the layer sequence in such a way that a haptically detectable movement of the cover element is brought about essentially parallel to, or parallel to, the direction of the movement impulse.

The first actuator can be designed to transmit a movement impulse, which is directed essentially perpendicularly to the side face of the layer sequence, in particular in an angular range between 90° and 80° with respect to the side face of the layer sequence, to at least the region of the side face, in order to bring about the haptically detectable movement of the cover element. At least in this case, the first actuator can be embodied, at least in certain regions (e.g. completely) in a strip shape or plate shape and can be arranged extending along a section of the side face of the layer sequence.

It is possible to provide for a multiplicity of first actuators to be arranged along the side face of the layer sequence. For example, two first actuators can be arranged on side faces adjoining one another (e.g. side faces running at right angle to one another) of the layer sequence and can bring about, on the corresponding regions of the side face, movement impulses which are directed essentially perpendicularly to one another.

A movement, in particular a linear movement, of the cover element can be brought about within a plane parallel to the upper side of the cover element by the movement impulse which is transmitted by means of the first actuator (or the movement impulses transmitted by means of the multiplicity of first actuators). Depending on the number and arrangement of the first actuators, this movement may be a unidimensional or a two-dimensional movement.

The first actuator can be designed to bring about a haptically detectable movement of the cover element relative to the touch-sensitive arrangement. The layer sequence can comprise a display arrangement which is arranged on the side of the cover element lying opposite the upper side, and the first actuator can be designed to bring about a haptically detectable movement of the cover element relative to the display arrangement. At least in this case it is possible to provide that the cover element and the touch-sensitive arrangement are designed to be moveable together or the cover element is designed to be moveable separately from other layers of the layer sequence.

The device can also comprise a frame which at least partially runs around the layer sequence. In this case, the first actuator can be designed to bring about a haptically detectable movement of the cover element relative to the frame. As an alternative to this it is possible to provide that the first actuator is designed to bring about a haptically detectable movement of the cover element and of the frame.

According to a third aspect, an electronic apparatus is specified. The electronic apparatus comprises any one of the touch-sensitive devices described herein and a processor device which is designed to actuate the first actuator or the first and second actuators. The electronic apparatus may be, for example, a portable electronic apparatus and can be, in particular, a mobile phone (a smartphone), a tablet computer or a laptop.

The processor device (e.g. a CPU of the electronic apparatus) can be designed to actuate the first actuator if the contact with the upper side of the cover element detected by means of the touch-sensitive arrangement can be assigned to the input operation. In addition, the processor device can be designed to actuate the second actuator if the contact with the upper side of the cover element detected by means of the touch-sensitive arrangement can be assigned to the scanning operation.

The assignment of the detected contact by the processor device can be carried out as a function of the force which is detected by means of the force sensor described here and is applied in the direction of the upper side of the cover element by the user. Alternatively or additionally to this, the processor device can be designed to assign the detected contact to the input operation and/or the scanning operation as a function of predefined contact patterns. Such contact patterns can include a contact duration and/or a contact sequence.

The layer sequence of the electronic apparatus can comprise the display arrangement which is described here and which is arranged on the side of the cover element lying opposite the upper side and is designed to display visual information. In addition, the processor device can be designed to assign the detected contact to the input operation and/or the scanning operation as a function of the displayed visual information. It is therefore possible, for example, for detected contact in the region of a virtual operator control element displayed by the display arrangement to indicate an input operation.

The electronic apparatus can also have a proximity sensor which is designed to detect a user approaching the upper side of the cover element and to bring about activation of the first actuator as a function of a distance between the user and the upper side of the cover element. The actuation of the first actuator can include, for example, pre-heating or energization of a shape memory alloy. As an alternative to the proximity sensor of the electronic apparatus, the second actuator which is included in the touch-sensitive arrangement can be embodied as a proximity sensor.

According to a fourth aspect, a motor vehicle is specified which comprises the electronic apparatus described herein. The motor vehicle can also comprise a securing system for releasably holding the (portable) electronic apparatus.

According to a fifth aspect, a method for bringing about haptic feedback to a user of an electronic apparatus is specified. The electronic apparatus comprises a touch-sensitive device with at least one first actuator, a second actuator and a layer sequence, wherein the layer sequence has a translucent element with upper side, and a touch-sensitive arrangement arranged on a side of the cover element lying opposite the upper side. The method comprises detecting a touch on the upper side of the cover element by a user of the apparatus by means of the touch-sensitive arrangement, transmitting a movement impulse to the layer sequence by means of the first actuator in such a way that a movement of the cover element which is detectable haptically by the user is brought about, and using the second actuator to generate electrostatic signals which are detectable haptically on the cover element by the user.

According to a sixth aspect, a method for bringing about haptic feedback to a user of an electronic apparatus is specified. The electronic apparatus comprises a touch-sensitive device with at least one first actuator and a layer sequence with a cover face and a circumferential side face. The layer sequence has a translucent cover element with an upper side which forms the cover face of the layer sequence, and a touch-sensitive arrangement arranged on a side of the cover element lying opposite the upper side. The method comprises detecting the a touch on the upper side of the cover element by a user of the apparatus by means of the touch-sensitive arrangement, and transmitting a movement impulse by means of the first actuator to at least one region of the side face of the layer sequence in such a way that a haptically detectable movement of the cover element is brought about essentially parallel to the direction of the movement impulse.

According to a seventh aspect, a computer program product is specified which is stored on a computer-readable memory, functionally capable of causing an electronic apparatus to carry out the method described here.

BRIEF DESCRIPTION OF THE DRAWINGS

Further advantages, details and features of the disclosure described here emerge from the following description of exemplary embodiments and from the figures, of which:

FIGS. 1A and 1B show schematic illustrations of an exemplary embodiment of an electronic apparatus and of a motor vehicle comprising the electronic apparatus;

FIGS. 3A to 3D show schematic illustrations of exemplary embodiments of a touch-sensitive device with at least one first actuator;

FIG. 4 shows a schematic illustration of an exemplary embodiment of a touch-sensitive device with two first actuators; and FIG. 5 shows a schematic illustration of an exemplary method of functioning of a first actuator.

DETAILED DESCRIPTION

Figure 2:
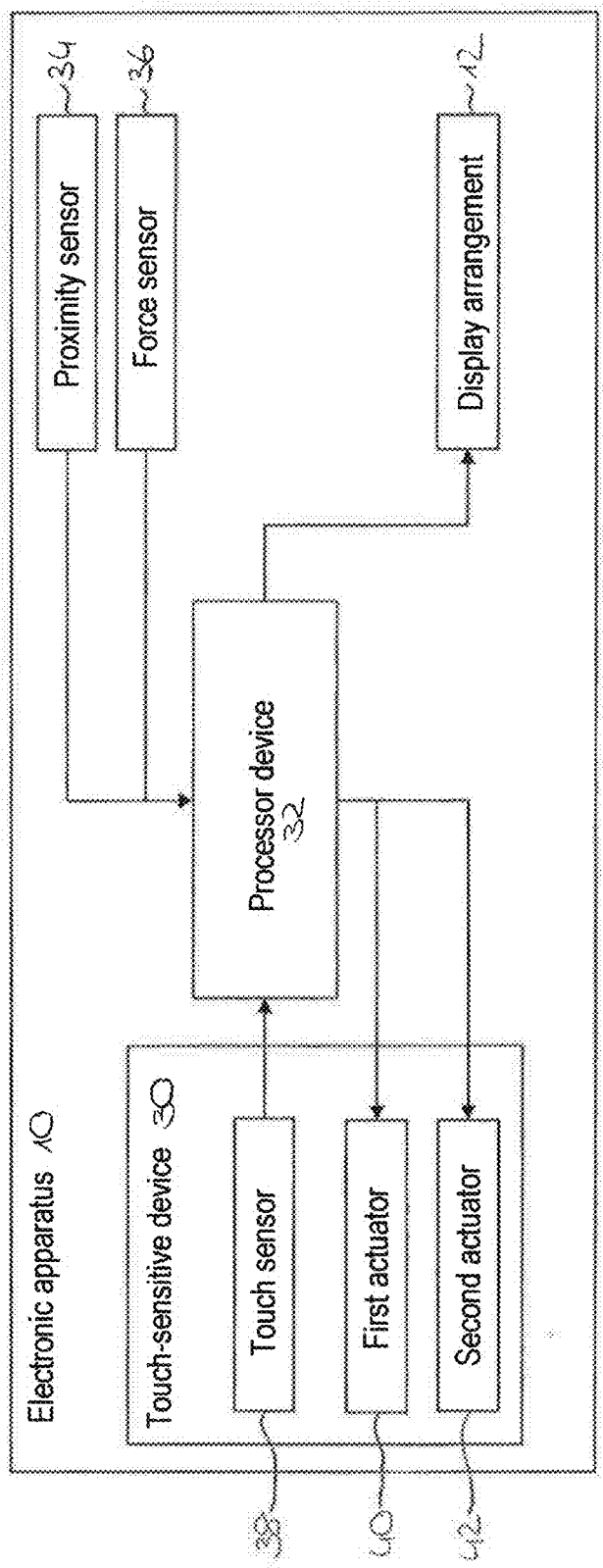
FIG. 2 shows a schematic illustration of an electronic apparatus with the touch-sensitive device.

FIGS. 1A and 1B show exemplary embodiments of an electronic apparatus, generally denoted by 10. The electronic apparatus 10 can be generally a mobile terminal such as a mobile phone (smartphone), a tablet computer or an e-book reading apparatus. In other exemplary embodiments, it can be a permanently installed apparatus. The electronic apparatus 10 can be, for example, permanently installed in a motor vehicle (for example in order to perform operator control of a multimedia unit and/or of specific vehicle functions such as a seat heater, an air-conditioning system etc.).

FIG. 1A shows a perspective view of the electronic apparatus 10 from the front. The electronic apparatus 10 comprises a display arrangement 12 which is arranged behind a translucent cover face and is surrounded by a frame 14. The display arrangement 12 can be a liquid crystal panel, an OLED panel, an LED panel or some other suitable display system (e.g. an e-paper display arrangement). The display arrangement 12 can be used to display visual information such as, for example, in the form of images and/or text. In the exemplary embodiment shown in FIGS. 1A and 1B, the display arrangement 12 is designed to display visual information with virtual operator control elements 16. The operator control elements 16 may, for example, be in the form of a control button or a pushbutton key. As shown in FIGS. 1A and 1B, the operator control elements 16 are emphasized visually by a boundary 18 against a background which surrounds the operator control elements 16 and is displayed by the display arrangement 12.

FIG. 1B shows a front view of a dashboard 20 of a motor vehicle, generally denoted by 22. The motor vehicle 22 comprises the electronic apparatus 10 which is described with reference to FIG. 1A. In the exemplary embodiment shown, the electronic apparatus 10 is permanently integrated into the dashboard 20 in the region of the centre console. Alternatively to this, it is possible to provide, for example, for the electronic apparatus 10 to be embodied as a portable apparatus. In this case, a securing device (e.g. integrated into the dashboard 20) can also be provided for releasably holding the electronic apparatus 10. The electronic apparatus 10 can correspond to a conventional multimedia unit of the motor vehicle 22, which multimedia unit is employed, for example, for the use and/or operator control of infotainment functions. Alternatively, the electronic apparatus 10 can also be installed as a central display unit in the region behind a steering wheel of the motor vehicle 22.

FIG. 2 shows a schematic illustration of an exemplary embodiment of an electronic apparatus 10. This can be the electronic apparatus 10 shown in FIGS. 1A and 1B. The electronic apparatus 10 comprises a touch-sensitive device, generally denoted by 30, a processor device 32, a proximity sensor 34, a force sensor 36 and a display arrangement 12 (as described with reference to FIGS. 1A and 1B).

The touch-sensitive device 30 comprises a touch sensor 38 which is designed to detect contact with the touch-sensitive device 30. In this context, in the exemplary embodiment shown in FIG. 2 there is provision that the touch sensor 38 detects the contact of a user with the cover face of the electronic apparatus 10 (as described with respect to FIG. 1A) in the manner of a touchpad or touchscreen. The touch sensor 38 can be embodied, for example, as a capacitive, inductive or resistive touch sensor. The touch sensor 38 of the touch-sensitive device 30 is electrically connected to the processor device 32 of the electronic apparatus 10.

The touch-sensitive device 30 also comprises a first actuator 40 and a second actuator 42. The processor device 32 actuates the first actuator 40 and/or the second actuator 42 as a function of a contact (i.e. a touch) detected by means of the touch sensor 38. In this context, there is provision in the exemplary embodiment shown in FIG. 2 that the processor device 32 actuates the first actuator 40 in the event of an input operation carried out by the user of the electronic apparatus 10. An input operation is to be understood as meaning, for example, that the user of the electronic apparatus 10 selects one of the operator control elements 16 shown in FIGS. 1A and 1B and displayed by the display arrangement 12. The processor device 32 is also designed to actuate the display arrangement 12 to display the visual information and to adapt the displayed visual information at least in the case of an input operation carried out by the user.

The first actuator 40 (also referred to below as a mechanical actuator) is designed to bring about a mechanical movement, which can be detected haptically by the user of the electronic apparatus 10, of the cover face, described with respect to FIG. 1A, of the electronic apparatus 10. It can be provided, for example, that the mechanical actuator brings about a movement of the cover face in the region of between approximately 100 µm and approximately 300 µm.

In the exemplary embodiment shown in FIG. 2 there is also provision that the processor device 32 is designed to actuate the second actuator 42 in the event of the scanning operation carried out by the user of the electronic apparatus 10. Such a scanning operation includes, for example, movement of a user's finger over the cover face of the electronic apparatus 10. The second actuator 42 (also referred to below as electrostatic actuator) is designed to generate electrostatic signals which can be detected haptically by the user in accordance with the visual information displayed by the display device 12.

The electrostatic signals correspond to a changing electrostatic (Coulomb) force between the user's finger and the cover face of the electronic apparatus 10. A surface frictional force perceived by the user is influenced by the electrostatic force. If the user in the example of the scanning operation moves his finger, for example, over a displayed boundary 18 of a virtual operator control element 16 (cf. FIGS. 1A and 1B), the surface frictional force is influenced in such a way that the sensation of an operator control element 16 which is embodied in three dimensions is simulated to the user (e.g. by simulating an edge of a control button). The electrostatic actuator 42 which is used for this purpose can contain a haptic processor according to the technology described in US 2015/0205357 A1.

The haptic feedback by means of the mechanical actuator 40 and the electrostatic actuator 42 therefore permits the user of the electronic apparatus 10 to carry out operator control or to control the electronic apparatus 10 without visual contact. Within the scope of the scanning operation, the haptic feedback of the electrostatic actuator 42 indicates to the user a position of virtual operator control elements 16 on the cover face of the electronic apparatus 10. When the operator control elements 16 are operated, an input operation is confirmed to the user by the haptic feedback of the mechanical actuator 40. When the electronic apparatus 10 is used in the motor vehicle 22 (cf. FIG. 1B), distraction of the driver of the motor vehicle from the traffic as a result of the driver operating the electronic apparatus 10 can therefore be minimized.

In another exemplary embodiment it is possible to provide that the mechanical actuator 40 brings about haptic feedback if the contact detected by means of the touch sensor 38 can be assigned to a scanning operation and/or the electrostatic actuator 42 brings about haptically detectable feedback if the contact can be assigned to an input operation. Alternatively or additionally to this, it is also possible to provide the processor device 32 designed to actuate a device (included in the touch-sensitive device 30 or the electronic apparatus 10) for generating an acoustic feedback if the detected contact can be assigned to an input operation.

The assignment of the contact detected by means of the touch sensor 38 as an input operation and/or a scanning operation is carried out by the processor device 32 in accordance with the exemplary embodiment shown in FIG. 2. The processor device 32 comprises at least one processor (e.g. a CPU—not illustrated) of the electronic apparatus 10 and a memory (not illustrated). The memory is designed to store at least one computer program product. In this context, the computer program product controls operations to be carried out by the processor. The memory can be, for example, a hard disk memory, removable storage or a semiconductor memory.

The assignment carried out by the processor device 32 comprises comparing the contact detected by means of the touch sensor 38 with predefined contact patterns which indicate an input operation or a scanning operation. Exemplary contact patterns of the input operation include contact with the cover face of the electronic apparatus 10 which lasts for a predefined time period and contact at essentially the same position on the cover face of the electronic apparatus 10 which repeats in a relatively short time interval. Alternatively or additionally to this, other contact patterns with a predefined contact duration and/or predefined contact sequence can be provided in order to assign the contact to the input operation or to the scanning operation.

The processor device 32 of the exemplary embodiment shown in FIG. 2 is also designed to take into account the visual information displayed by the display device 12 during the assignment of the contact detected by means of the touch sensor 38. There is therefore provision for detected contact within a boundary 18, displayed by the display device 12, of an operator control element 16 (cf. FIGS. 1A and 1B) to be assigned with greater probability to an input operation than detected contact outside the boundaries 18 of one of the operator control elements 16.

The proximity sensor 34 of the electronic apparatus 10 in accordance with the exemplary embodiment shown in FIG. 2 is designed to detect the user approaching the cover face of the electronic apparatus 10. In this context, the proximity sensor 34 can be embodied, for example, as an inductive or capacitive proximity sensor. Alternatively or additionally to this, there can be provision that the electrostatic actuator 42 is embodied as a proximity sensor. In this case, there can be provision that the electrostatic actuator 42 detects as soon as an electrostatic force is built up between the user (e.g. the user's finger) and the cover face of the electronic apparatus 10.

In the exemplary embodiment shown in FIG. 2, the proximity sensor 34 is electrically connected to the processor device 32. The processor device 32 is also designed to bring about activation of the mechanical actuator 40 as a function of a distance (detected by the proximity sensor 34 and/or the electrostatic actuator 42) between the user and the cover face of the electronic apparatus 10. In this context there may be provision, for example, that the mechanical actuator 40 is activated if the distance corresponds to a predefined distance threshold value or undershoots said distance threshold value.

The force sensor 36 of the electronic apparatus 10 is designed to detect a force applied in the direction of the cover face of the electronic apparatus 10 by the user. In the exemplary embodiment shown in FIG. 2 there is provision that the processor device 32 (electrically connected to the force sensor 36) assigns contact detected by means of the touch sensor 38 to an input operation if the force detected by the force sensor 36 corresponds to a force threshold value or exceeds said force threshold value.

In the exemplary embodiment shown in FIG. 2, the proximity sensor 34, the force sensor 36 and the display arrangement 12 are illustrated as components which are separate from the touch-sensitive device 30. In another exemplary embodiment, the proximity sensor 34, the force sensor 36 and/or the display arrangement 12 can be provided as part of the touch-sensitive device 30.

FIGS. 3A to 3D show schematic side views of exemplary embodiments of a touch-sensitive device 30. This can be the touch-sensitive device 30 as described with reference to the exemplary embodiment shown in FIG. 2.

The touch-sensitive device 30 comprises a layer sequence, generally denoted by 50, a frame 51 which partially runs around the layer sequence 50, and the mechanical actuator 40 (cf. FIG. 2). As illustrated in FIG. 3A, the electrostatic actuator 42 can also be part of the touch-sensitive device 30 in accordance with the exemplary embodiments shown in FIGS. 3A to 3D.

The layer sequence 50 has an upper side 54 and a circumferential side face 56. In this context, the upper side 54 of the layer sequence 50 can form the cover face, described with respect to FIG. 1A, of the electronic apparatus 10 (cf. FIGS. 1A to 2). The upper side 54 of the layer sequence 50 is formed by the upper side of a translucent cover element 52 included in the layer sequence 50. The translucent cover element 52 can be composed, for example, of conventional glass or alternatively to this can comprise plastic, composite glass or chemically prestressed glass.

The layer sequence 50 also comprises a touch-sensitive arrangement 38 which is arranged on an underside, lying opposite the upper side, of the cover element 52.

The touch-sensitive arrangement 38 corresponds here to the touch sensor described with respect to FIG. 2. In the exemplary embodiment shown in FIGS. 3A to 3D, the touch sensor 38 is mounted on the underside of the cover element 52. The touch sensor 38 can be embodied, for example, as a glass sensor or a film sensor. Alternatively to this it is possible to provide for the touch sensor 38 to be attached to the underside of the cover element 52, for example as a TOG (Touch On Glass) or WIT (Window Integrated Touch) sensor.

The layer sequence 50 also has the display arrangement 12 described with respect to the preceding figures. In the exemplary embodiment shown in FIGS. 3A to 3D, the display arrangement 12 is arranged on an underside, facing away from the cover element 52, of the touch sensor 38. In addition, there can be provision for the electrostatic actuator 42 to be arranged on an underside, facing away from the cover element 52, of the display arrangement 12 (cf. FIG. 3A).

As shown in FIGS. 3A to 3D, the mechanical actuator 40 is arranged adjoining a region (also referred to below as the activation region) of the side face 56 of the layer sequence 50. FIGS. 3B and 3D illustrate the input operation, described with respect to FIG. 2, by the user of the touch-sensitive device 30 or of the electronic apparatus 10 (cf. FIGS. 1A to 2). The mechanical actuator 40, which is actuated, (by the processor device 32 according to FIG. 2) is designed to transmit a movement impulse to the activation region of the side face 56.

The double arrows in FIGS. 3B and 3D mark a haptically detectable movement, originating from the movement impulse, of the upper side 54 of the layer sequence 50 parallel to the direction of the movement impulse. In the exemplary embodiments shown in FIGS. 3A to 3D, the movement impulse transmitted by means of the mechanical actuator 40 is directed perpendicularly to the activation region of the side face 56 of the layer sequence 50. Alternatively to this, the mechanical actuator 40 can be designed, for example, to transmit a movement impulse, directed in an angular range between approximately 80° and <90° with respect to the side face 56 of the layer sequence 50, to the activation region of the side face 56.

In the exemplary embodiments of the touch-sensitive device 30 which are shown in FIGS. 3A to 3D the side face 56 of the layer sequence 50 is formed by a side face of the cover element 52 and a side face of the touch sensor 38 attached to the cover element 56. In an alternative exemplary embodiment, the side face 56 of the layer sequence 50 can be formed, in addition to or as an alternative to the side face of the touch sensor 38, by a side face of the display device 12, by the frame 51 and/or by a side face of the electrostatic actuator 42 (assigned to the layer sequence 50, cf. FIG. 3A). It is also possible to provide that the side face 56 of the layer sequence 50 is formed only by the side face of the cover element 56.

In the exemplary embodiment, shown in FIGS. 3A and 3B, of the touch sensitive device 30, the display device 12 is attached to the underside of the touch sensor 38. The movement impulse which is transmitted by the mechanical actuator 40 to the activation region of the side face 56 of the layer sequence 50 brings about a movement of the cover element 52, of the touch sensor 38 and of the display device 12 relative to the frame 51.

In the exemplary embodiment of the touch-sensitive device 30 which is shown in FIGS. 3C and 3D, the display arrangement 12 is arranged spaced apart from the underside of the touch sensor 38. The movement impulse which is transmitted to the activation region of the side face 56 of the layer sequence 50 by means of the mechanical actuator 40 therefore brings about, in contrast to the exemplary embodiment shown in FIGS. 3A and 3B, a movement of the cover element 52 and of the touch sensor 38 relative to the frame 51 and relative to the display arrangement 12.

In another exemplary embodiment of the touch-sensitive device 30, the touch sensor 38 can be arranged spaced apart from the cover element 52. At least in this case, the mechanical actuator 40 can be designed to bring about a movement of the cover element 52 relative to the touch sensor 38. In addition, a sequence of the arrangement of the touch sensor 38 and of the display arrangement 12 (and of the electrostatic actuator 42), starting from the cover element 52, within the layer sequence 50 can be different to the sequence shown in FIGS. 3A to 3D.

In the exemplary embodiment shown in FIGS. 3A to 3D the (bonding) frame 51 is connected via the mechanical actuator 40 to the layer sequence 50 (specifically to the touch sensor 38 and/or to the cover element 52). As described above, at least the cover element 52 can be moved relative to the frame 51. Alternatively to this, it is possible to provide that the frame 51 is connected to the layer sequence 50, in particular to the cover element 52 in such a way that a movement of the frame 51 is brought about by the movement impulse transmitted to the activation region of the side face 56 of the layer sequence 50 by means of the mechanical actuator 40.

FIG. 4 shows a perspective view of an exemplary embodiment of a touch-sensitive device 30 from the front. This can be here the touch-sensitive device 30 described with respect to FIGS. 2 to 3D.

The touch-sensitive device 30 comprises the layer sequence 50 (cf. FIGS. 3A to 3D) and two mechanical actuators 40 described with respect to FIGS. 2 to 3D. In the exemplary embodiment shown in FIG. 4, the mechanical actuators 40 extend along two sections 57, 58, oriented essentially perpendicularly with respect to one another, of the side faces 56 of the layer sequence 50. Alternatively or additionally to this, there can be provision to arrange a multiplicity (e.g. two) mechanical actuators 40 along one of the sections 57, 58 of the side face 56 of the layer sequence 50.

Activation sections, facing the side face 56 of the layer sequence 50, of the mechanical actuators 40 are of strip-shaped design in the exemplary embodiment shown in FIG. 4. Alternatively to this, the activation sections of the mechanical actuators 40 can be embodied differently to this, for example in the form of a rectangular, and in particular square, plate.

In each case a movement impulse is transmitted to the side face 56 of the layer sequence 50 by the mechanical actuators 40 in such a way that a movement of the upper side 54 of the layer sequence 50 is brought about within a plane parallel to the upper side of the layer sequence 50 (denoted as the x/y plane in FIG. 4). Depending on the arrangement and number of the mechanical actuators 40 along the side face 56 of the layer sequence 50, a (in particular linear) unidimensional movement (as indicated in FIGS. 3B and 3D) or a two-dimensional movement is brought about in accordance with the exemplary embodiment shown in FIG. 4.

As a result of the arrangement of the mechanical actuator 40 or the multiplicity of mechanical actuators 40 (cf. FIGS. 2 to 4) on the side faces 56 of the layer sequence 50, a height of the touch-sensitive device 30 starting from the upper side 54 of the layer sequence 50 or a height of the electronic apparatus 10 starting from the cover face is significantly reduced compared to known arrangements of mechanical actuators (such as, e.g., on an underside of a touch-sensitive device).

FIG. 5 shows a schematic illustration of the method of functioning for bringing about a haptic feedback by means of the mechanical actuator 40 described with respect to FIGS. 2 to 4 (or a multiplicity of mechanical actuators 40) to a user of an electronic apparatus 10 (cf. FIGS. 1A to 2).

A state denoted by I describes a state of rest of the mechanical actuator 40. As illustrated in FIG. 5, the mechanical actuator 40 is in the state of rest when the user (or a finger of the user) is spaced apart from the upper side 54 of the layer sequence 50 (or from the upper side of the cover element 52) of the touch-sensitive device 30 (cf. FIGS. 3A to 3C).

In the state denoted by II, the user approaches the upper side 54 of the layer sequence 50. A proximity sensor 34 described with respect to FIG. 2 is designed to detect the entry (illustrated in FIG. 5) of the user into a detection range 60 of the proximity sensor 34, and to generate a signal $S_N$ which indicates the approach of the user. As described with respect to FIG. 2, the processor device 32 of the electronic apparatus 10 is designed to bring about activation of the mechanical actuator 40 on the basis of the proximity signal $S_N$.

In the exemplary embodiments shown in FIGS. 2 to 5, the mechanical actuator 40 comprises (or the mechanical actuators 40 comprise) a Shape Memory Alloy (SMA) in the form of a nickel titanium wire 62. However, another shape memory alloy can also be provided as an alternative to this. The shape memory alloy can be activated by energization or heating of the shape memory alloy depending on the embodiment thereof.

In the exemplary embodiment shown in FIG. 5, the energization of the wire 62 brings about a shortening of the wire length (as illustrated with respect to state II). The wire 62 assumes a Martensite form. The activation of the mechanical actuator 40 or the shortening of the wire length brings about a movement, indicated by the arrow in state II, of the upper side 54 of the layer sequence 50 in the direction of the activation section of the side face 56 (as described with respect to FIGS. 3A to 3D).

Subsequent to state II, in the exemplary embodiment shown in FIG. 5 the upper side 54 of the layer sequence 50 is touched by the user. The force sensor 36, described with respect to FIG. 2, of the electronic apparatus 10 is designed to detect a force $F_B$ applied in the direction of the upper side 54 of the layer sequence 50 by the user. In a state III, the force $F_B$ detected by the force sensor 36 reaches a force threshold value $F_S$. The processor device 32 (cf. FIG. 2) actuates the mechanical actuator 40 to transmit a movement impulse to the side face 56 of the layer sequence 50, which movement impulse brings about a movement of the cover element parallel to the direction of the movement impulse, as illustrated by the arrows in state III. The movement impulse is generated by stopping the energization of the wire 62, as a result of which the wire length becomes greater. The wire 62 assumes an Austenite form. The movement, starting from the change in length of the wire 62, of the upper side 54 of the layer sequence 50 can be detected haptically by the user.

In an alternative exemplary embodiment, the mechanical actuator 40 described with respect to FIGS. 2 to 5 can be a magnetic actuator or a piezoelectric actuator. In addition, the step of activating the mechanical actuator 40 can be adapted to the embodiment thereof or omitted.

The described exemplary embodiments specify various features of a touch-sensitive device and of an electronic apparatus comprising the touch-sensitive device. In a different exemplary embodiment these features can be combined or modified as desired.

The invention claimed is:

1. A touch-sensitive device with haptic feedback, comprising:
    a layer sequence comprising a translucent cover element with an upper side and a touch-sensitive arrangement which is arranged on a side of the cover element lying opposite the upper side and is designed to detect contact on the upper side of the cover element;
    at least one first actuator which is designed to transmit a movement impulse to the layer sequence in such a way that a haptically detectable movement of the cover element is brought about, wherein the layer sequence further comprises a display arrangement which is arranged on the side of the cover element lying opposite the upper side, and wherein the first actuator is designed to bring about a haptically detectable movement of the cover element relative to the display arrangement; and
    a second actuator which is designed to generate electrostatic signals which are detectable haptically at the cover element.

2. The device according to claim 1, wherein display arrangement is designed to display visual information, and wherein the second actuator is designed to generate the electrostatic signals in accordance with the displayed visual information.

3. The device according to claim 2, wherein the visual information contains at least one virtual operator control element, and the electrostatic signals indicate a boundary of the at least one operator control element.

4. The device according to claim 1, wherein the first actuator is designed to transmit the movement impulse to the layer sequence when the contact detected by means of the touch-sensitive arrangement is assignable to an input operation.

5. The device according to claim 1, wherein the second actuator is designed to generate the electrostatic signal when the contact detected by means of the touch-sensitive arrangement is assignable to a scanning operation.

6. The device according to claim 1, wherein the layer sequence comprises a cover face formed by the upper side of the cover element and a circumferential side face; and
wherein the first actuator is designed to transmit the movement impulse to at least one region of the side face of the layer sequence in such a way that a haptically detectable movement of the cover element is brought about essentially parallel to a direction of the movement impulse.

7. The device according to claim 1, wherein the first actuator is designed to bring about a haptically detectable movement of the cover element relative to the touch-sensitive arrangement.

8. The device according to claim 1, further comprising a frame which at least partially runs around the layer sequence, wherein the first actuator is designed to bring about a haptically detectable movement of the cover element relative to the frame.

9. A motor vehicle comprising a touch-sensitive device with haptic feedback according to claim 1.

10. A method for bringing about haptic feedback to a user of an electronic apparatus which comprises a touch-sensitive device, a processor device and a proximity sensor, the touch-sensitive device having at least one first actuator, a second actuator and a layer sequence, wherein the layer sequence comprises a translucent cover element with an upper side, and a touch-sensitive arrangement arranged on a side of the cover element lying opposite the upper side, wherein the layer sequence further comprises a display arrangement which is arranged on the side of the cover element lying opposite the upper side, wherein the processor is designed to actuate the first and second actuators, the method comprising:
generating by the proximity sensor a proximity signal indicative of a user approaching the upper side of the cover element;
bringing about by the processor device activation of the first actuator on the basis of the proximity signal;
detecting a touch by a user of the apparatus on the upper side of the cover element by means of the touch-sensitive arrangement;
transmitting a movement impulse to the layer sequence by means of the first actuator in such a way that a movement of the cover element which is detectable haptically by the user is brought about, wherein the first actuator is designed to bring about a haptically detectable movement of the cover element relative to the display arrangement; and
using the second actuator to generate electrostatic signals which are detectable haptically on the cover element by the user.

11. A computer program product which is stored on a non-transitory computer-readable memory, functionally capable of causing an electronic apparatus to carry out the method according to claim 10.

12. A touch-sensitive device with haptic feedback comprising:
a layer sequence with a cover face and a circumferential side face, wherein the layer sequence comprises:
a translucent cover element with an upper side which forms the cover face of the layer sequence, and
a touch-sensitive arrangement which is arranged on a side of the cover element lying opposite the upper side and is designed to detect contact on the upper side of the cover element; and
at least a first actuator which is designed to transmit a movement impulse to at least one region of the side face of the layer sequence in such a way that a haptically detectable movement of the cover element is brought about essentially parallel to a direction of the movement impulse, wherein the layer sequence further comprises a display arrangement which is arranged on the side of the cover element lying opposite the upper side, and wherein the first actuator is designed to bring about a haptically detectable movement of the cover element relative to the display arrangement.

13. The device according to claim 12, wherein the first actuator is designed to transmit the movement impulse, which is directed essentially perpendicularly to the side face of the layer sequence, to at least the region of the side face, in order to bring about the haptically detectable movement of the cover element.

14. The device according to claim 12, wherein the first actuator is embodied in a strip shape or plate shape and is arranged extending at least in a certain region along a section of the side face of the layer sequence.

15. The device according to claim 12, wherein a movement, in particular a linear unidimensional movement, of the cover element is brought about within a plane parallel to the upper side of the cover element by the movement impulse which is transmitted by means of the first actuator.

16. The device according to claim 12, also comprising a second actuator which is designed to generate electrostatic signals that are detectable haptically at the cover element.

17. An electronic apparatus comprising:
a touch-sensitive device according to claim 12; and
a processor device which is designed to actuate the first actuator.

18. An electronic apparatus comprising:
a touch-sensitive device according to claim 1; and
a processor device which is designed to actuate the first and second actuators.

19. The device according to claim 18, wherein the processor device is designed to actuate the first actuator if the contact detected by means of the touch-sensitive arrangement is assignable to an input operation.

20. The device according to claim 18, wherein the processor device is designed to actuate the second actuator if the contact detected by means of the touch-sensitive arrangement is assignable to a scanning operation.

21. The electronic apparatus according to claim 18,
wherein the processor device is designed to actuate the first actuator if the contact detected by means of the touch-sensitive arrangement is assignable to an input operation, or
wherein the processor device is designed to actuate the second actuator if the contact detected by means of the touch-sensitive arrangement is assignable to a scanning operation; and
wherein the processor device is designed to assign the detected contact to the input operation and/or the scanning operation as a function of predefined contact patterns.

22. The electronic apparatus according to claim 18,
wherein the processor device is designed to actuate the first actuator if the contact detected by means of the touch-sensitive arrangement is assignable to an input operation, or wherein the processor device is designed to actuate the second actuator if the contact detected by means of the touch-sensitive arrangement is assignable to a scanning operation;

wherein the layer sequence has a display arrangement which is arranged on the side of the cover element lying opposite the upper side and is designed to display visual information; and wherein the processor device is designed to assign the detected contact to the input operation and/or the scanning operation as a function of the displayed visual information.

23. The electronic apparatus according to claim 18, wherein the electronic apparatus further comprises a proximity sensor which is designed to detect a user approaching the upper side of the cover element and to bring about activation of the first actuator as a function of a distance between the user and the upper side of the cover element; or wherein the second actuator is embodied as the proximity sensor.

24. A method for bringing about haptic feedback to a user of an electronic apparatus which comprises a touch-sensitive device with at least one first actuator and a layer sequence with a cover face and a circumferential side face, wherein the layer sequence comprises a translucent cover element with an upper side which forms the cover face of the layer sequence, and a touch-sensitive arrangement arranged on a side of the cover element lying opposite the upper side, wherein the layer sequence further comprises a display arrangement which is arranged on the side of the cover element lying opposite the upper side, the method comprising:

detecting contact with the upper side of the cover element by a user of the apparatus by means of the touch-sensitive arrangement; and transmitting a movement impulse by means of the first actuator to at least one region of the side face of the layer sequence in such a way that a haptically detectable movement of the cover element is brought about essentially parallel to the direction of the movement impulse, wherein the first actuator is designed to bring about a haptically detectable movement of the cover element relative to the display arrangement.

25. The electronic apparatus according to claim 17, wherein the electronic apparatus further comprises a proximity sensor which is designed to detect a user approaching the upper side of the cover element and to bring about activation of the first actuator as a function of a distance between the user and the upper side of the cover element; or wherein the second actuator is embodied as the proximity sensor.

26. A motor vehicle comprising an electronic apparatus according to claim 17.

27. A computer program product which is stored on a non-transitory computer-readable memory, functionally capable of causing an electronic apparatus to carry out the method according to claim 24.

* * * * *